US012593635B2

(12) United States Patent

Huang

(10) Patent No.: US 12,593,635 B2

(45) Date of Patent: Mar. 31, 2026

(54) SEMICONDUCTOR DEVICE STRUCTURE WITH COMPOSITE HARD MASK AND METHOD FOR PREPARING THE SAME

(71) Applicant: NANYA TECHNOLOGY CORPORATION, New Taipei City (TW)

(72) Inventor: Tse-Yao Huang, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 379 days.

(21) Appl. No.: 18/142,164

(22) Filed: May 2, 2023

(65) Prior Publication Data

US 2024/0371651 A1 Nov. 7, 2024

(51) Int. Cl.
*H10P 50/00* (2026.01)

(52) U.S. Cl.
CPC .................................... *H10P 50/73* (2026.01)

(58) Field of Classification Search
CPC ........... H01L 21/31144; H01L 21/0337; H01L 21/76264
See application file for complete search history.

(56) References Cited

U.S. PATENT DOCUMENTS

| | | | | |
|---|---|---|---|---|
| 2015/0318181 A1* | 11/2015 | Cantone | ............. | H01L 21/3086 |
| | | | | 438/702 |
| 2016/0307769 A1* | 10/2016 | Tseng | ................... | H10D 30/024 |

| | | | | |
|---|---|---|---|---|
| 2017/0271160 A1* | 9/2017 | Yen | ................... | H01L 21/76829 |
| 2019/0164808 A1* | 5/2019 | Hattendorf | ........ | H01L 21/02636 |
| 2019/0165172 A1* | 5/2019 | Joshi | ................. | H10D 84/0172 |
| 2023/0020933 A1* | 1/2023 | Wang | ................. | H10D 84/0149 |

(Continued)

FOREIGN PATENT DOCUMENTS

| | | |
|---|---|---|
| TW | 201735111 A | 10/2017 |
| TW | 202305873 A | 2/2023 |
| TW | 202306155 A | 2/2023 |

(Continued)

OTHER PUBLICATIONS

Office Action and and the search report mailed on Nov. 16, 2023 related to Taiwanese Application No. 112126354.

*Primary Examiner* — Eliseo Ramos Feliciano
*Assistant Examiner* — Sophia W Kao
(74) *Attorney, Agent, or Firm* — Xuan Zhang

(57) ABSTRACT

A semiconductor device structure includes a first dielectric layer disposed over a semiconductor substrate, and a second dielectric layer disposed over the first dielectric layer. The semiconductor device structure also includes a first semiconductor structure disposed over the second dielectric layer. The first semiconductor structure has a first portion and a second portion separated from each other by an opening. The semiconductor device structure further includes a second semiconductor structure disposed over the second dielectric layer and in the opening. The second semiconductor structure has a first portion and a second portion separated from each other. Moreover, the first portion of the second semiconductor structure is in direct contact with the first portion of the first semiconductor structure, and the second portion of the second semiconductor structure is in direct contact with the second portion of the first semiconductor structure.

15 Claims, 19 Drawing Sheets

(56) References Cited

U.S. PATENT DOCUMENTS

| 2023/0032703 A1* | 2/2023 | Chang | ................. | H01L 21/0273 |
| 2023/0197856 A1* | 6/2023 | Chen | ................... | H10D 62/121 |
| | | | | 257/295 |

FOREIGN PATENT DOCUMENTS

| TW | 202316568 A | 4/2023 |
| TW | 202316576 A | 4/2023 |

* cited by examiner

SEMICONDUCTOR DEVICE STRUCTURE WITH COMPOSITE HARD MASK AND METHOD FOR PREPARING THE SAME

TECHNICAL FIELD

The present disclosure relates to a semiconductor device structure and a method for preparing the same, and more particularly, to a semiconductor device structure with a composite hard mask and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first semiconductor structure disposed over the second dielectric layer. The first semiconductor structure has a first portion and a second portion separated from each other by an opening. The semiconductor device structure further includes a second semiconductor structure disposed over the second dielectric layer and in the opening. The second semiconductor structure has a first portion and a second portion separated from each other. Moreover, the first portion of the second semiconductor structure is in direct contact with the first portion of the first semiconductor structure, and the second portion of the second semiconductor structure is in direct contact with the second portion of the first semiconductor structure.

In an embodiment, a width of the first portion of the first semiconductor structure is substantially the same as a width of the first portion of the second semiconductor structure. In an embodiment, the first portion and the second portion of the first semiconductor structure and the first portion and the second portion of the second semiconductor structure are in direct contact with a top surface of the second dielectric layer. In an embodiment, the first portion and the second portion of the first semiconductor structure are made of a first semiconductor material, the first portion and the second portion of the second semiconductor structure are made of a second semiconductor material, and the first semiconductor material is different from the second semiconductor material.

In an embodiment, the first semiconductor material includes silicon (Si) or silicon germanium (SiGe). In an embodiment, the second semiconductor material includes germanium (Ge). In an embodiment, the first dielectric layer and the second dielectric layer are made of different materials. In an embodiment, the first dielectric layer includes silicon dioxide ($SiO_2$), and the second dielectric layer includes silicon nitride ($Si_3N_4$).

In another embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first semiconductor structure disposed over the second dielectric layer. The first semiconductor structure has a first portion and a second portion separated from each other, and a sidewall of the first portion of the first semiconductor structure is facing a sidewall of the second portion of the first semiconductor structure. The semiconductor device structure further includes a second semiconductor structure disposed over the second dielectric layer. The second semiconductor structure has a first portion and a second portion separated from each other. Moreover, a sidewall of the first portion of the second semiconductor structure adjoins the sidewall of the first portion of the first semiconductor structure, and a sidewall of the second portion of the second semiconductor structure adjoins the sidewall of the second portion of the first semiconductor structure.

In an embodiment, the first semiconductor structure includes silicon (Si), and the second semiconductor structure includes germanium (Ge). In an embodiment, a top surface of the first portion of the first semiconductor structure is level with a top surface of the first portion of the second semiconductor structure. In an embodiment, a bottom surface of the first portion of the first semiconductor structure and a bottom surface of the first portion of the second semiconductor structure are in direct contact with a top surface of the second dielectric layer. In an embodiment, the first semiconductor structure further includes a third portion, and a distance between the first portion and the third portion of the first semiconductor structure is substantially the same as a distance between the first portion and the second portion of the second semiconductor structure.

In an embodiment, the second semiconductor structure further includes a third portion having a sidewall adjoining a sidewall of the third portion of the first semiconductor structure, wherein the first portion and the third portion of the first semiconductor structure are disposed between the first portion and the third portion of the second semiconductor structure. In an embodiment, a width of the first portion of the first semiconductor structure is substantially the same as a width of the third portion of the first semiconductor structure, and the distance between the first portion and the third portion of the first semiconductor structure is twice the width of the first portion of the first semiconductor structure.

In yet another embodiment of the present disclosure, a method for preparing a semiconductor device structure is provided. The method includes forming a first dielectric layer over a semiconductor substrate, and forming a second dielectric layer over the first dielectric layer. The method also includes forming a third dielectric layer over the second dielectric layer, and forming a fourth dielectric layer over the third dielectric layer. The method further includes partially removing the fourth dielectric layer to form an upper opening, and partially removing the third dielectric layer to form a lower opening. A width of the lower opening is greater than a width of the upper opening. In addition, the method includes forming a first semiconductor structure in the lower opening. The first semiconductor structure has a first portion and a second portion covering opposite sidewalls of the lower opening. The method also includes forming a second semiconductor structure between the first portion and the second portion of the first semiconductor structure. The second semiconductor structure has a first portion and a second portion separated from each other. The first portion of the second semiconductor structure is in direct contact with the first portion of the first semiconductor structure, and the second portion of the second semiconductor structure is in direct contact with the second portion of the first semiconductor structure. The method further includes removing the third dielectric layer and the fourth dielectric layer after the first semiconductor structure and the second semiconductor structure are formed.

In an embodiment, the first dielectric layer and the third dielectric layer are made of a first dielectric material, the second dielectric layer and the fourth dielectric layer are made of a second dielectric material, and the second dielectric material is different from the first dielectric material. In an embodiment, the third dielectric layer is partially removed through the upper opening in the fourth dielectric layer, and a bottom surface of the fourth dielectric layer is exposed by the lower opening. In an embodiment, the step of forming the first semiconductor structure includes depositing a first semiconductor layer over the fourth dielectric layer and in the upper opening and the lower opening, and etching the first semiconductor layer to expose a top surface of the second dielectric layer such that the first portion and the second portion of the first semiconductor structure are separated from each other.

In an embodiment, a bottom surface of the fourth dielectric layer is exposed after the first semiconductor structure is formed. In an embodiment, the first portion and the second portion of the second semiconductor structure are in direct contact with a bottom surface of the fourth dielectric layer and a top surface of the second dielectric layer. In an embodiment, the method further includes forming a carbon-based layer over the fourth dielectric layer and between the first portion and the second portion of the second semiconductor structure. In an embodiment, the method further includes etching the carbon-based layer using the fourth dielectric layer as a mask, such that a recess is formed over a remaining portion of the carbon-based layer between the first portion and the second portion of the second semiconductor structure. In an embodiment, the method further includes removing the remaining portion of the carbon-based layer after the fourth dielectric layer is removed.

Embodiments of a semiconductor device structure and method for preparing the same are provided in the disclosure. In some embodiments, the semiconductor device structure includes a plurality of dielectric layers disposed over a semiconductor substrate, and a first semiconductor structure and a second semiconductor structure disposed over the plurality of dielectric layers. The first semiconductor structure has a first portion and a second portion separated from each other, and the second semiconductor structure has a first portion and a second portion separated from each other. The first portion of the second semiconductor structure is in direct contact with the first portion of the first semiconductor structure, and the second portion of the second semiconductor structure is in direct contact with the second portion of the first semiconductor structure. The first semiconductor structure and the second semiconductor structure are made of different materials, which collectively form a composite hard mask over the plurality of dielectric layers, and the composite hard mask can be utilized in subsequent etching process(es) to remove undesired portions of the underlying dielectric layers. As a result, manufacturing cost and processing time can be reduced, and yield of the semiconductor device structure can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
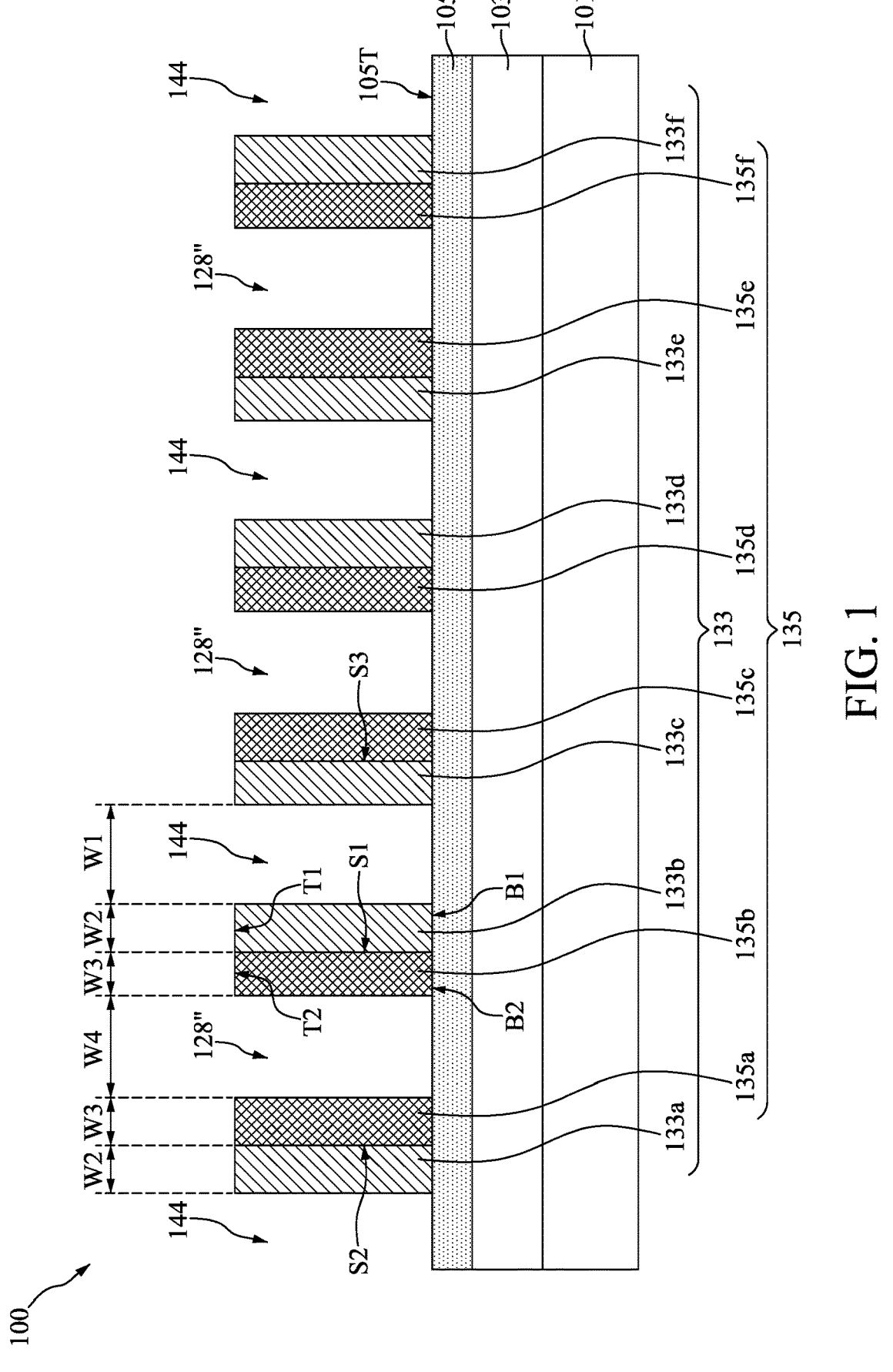
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100, in accordance with some embodiments. As shown in FIG. 1, the semiconductor device structure 100 includes a semiconductor substrate 101, a first dielectric layer 103 disposed over the semiconductor substrate 101, and a second dielectric layer 105 disposed over the first dielectric layer 103, in accordance with some embodiments. In some embodiments, the semiconductor device structure 100a also includes a first semiconductor structure 133 and a second semiconductor structure 135 disposed over the second dielectric layer 105.

In some embodiments, the first semiconductor structure 133 includes a plurality of portions 133a, 133b, 133c, 133d, 133e and 133f, and the portions 133a, 133b, 133c, 133d, 133e and 133f are separated from each other. In some embodiments, the second semiconductor structure 135 includes a plurality of portions 135a, 135b, 135c, 135d, 135e and 135f, and the portions 135a, 135b, 135c, 135d, 135e and 135f are separated from each other. In some embodiments, each of the portions 133a, 133b, 133c, 133d, 133e and 133f of the first semiconductor structure 133 is in direct contact with each of the portions 135a, 135b, 135c, 135d, 135e and 135f of the second semiconductor structure 135.

In some embodiments, each of the portions 135a, 135b, 135c, 135d, 135e and 135f of the second semiconductor structure 135 has a sidewall adjoining a sidewall of the respective portions 133a, 133b, 133c, 133d, 133e and 133f of the first semiconductor structure 133. For example, a sidewall of the portion 135a of the second semiconductor structure 135 adjoins a sidewall of the portion 133a of the first semiconductor structure 133 (sidewall S2 is referred to as the sidewall of the portion 135a and the sidewall of the portion 133a since they are abutting). Similarly, a sidewall of the portion 135b of the second semiconductor structure 135 adjoins a sidewall of the portion 133b of the first semiconductor structure 133 (sidewall S1 is referred to as the sidewall of the portion 135b and the sidewall of the portion 133b since they are abutting), and a sidewall of the portion 135c of the second semiconductor structure 135 adjoins a sidewall of the portion 133c of the first semiconductor structure 133 (sidewall S3 is referred to as the sidewall of the portion 135c and the sidewall of the portion 133c since they are abutting).

In some embodiments, the top surfaces of the portions 133a, 133b, 133c, 133d, 133e, 133f of the first semiconductor structure 133 are level with the top surfaces of the portions 135a, 135b, 135c, 135d, 135e, 135f of the second semiconductor structure 135. For example, the top surface T1 of the portion 133b of the first semiconductor structure 133 is level with the top surface T2 of the portion 135b of the second semiconductor structure 135. In some embodiments, the bottom surfaces of the portions 133*a*, 133*b*, 133*c*, 133*d*, 133*e*, 133*f* of the first semiconductor structure 133 and the bottom surfaces of the portions 135*a*, 135*b*, 135*c*, 135*d*, 135*e*, 135*f* of the second semiconductor structure 135 are in direct contact with the top surface 105T of the second dielectric layer 105. For example, the bottom surface B1 of the portion 133*b* of the first semiconductor structure 133 and the bottom surface B2 of the portion 135*b* of the second semiconductor structure 135 are in direct contact with the top surface 105T of the second dielectric layer 105.

Moreover, in some embodiments, the portions 135*a* and 135*b* of the second semiconductor structure 135 are separated by an opening 128", the portions 135*c* and 135*d* of the second semiconductor structure 135 are separated by an opening 128", and the portions 135*e* and 135*f* of the second semiconductor structure 135 are separated by an opening 128". In some embodiments, the portions 133*b* and 133*c* of the first semiconductor structure 133 are separated by an opening 144, and the portions 133*d* and 133*e* of the first semiconductor structure 133 are separated by an opening 144. In some embodiments, the portion of the first semiconductor structure 133 and the portion of the second semiconductor structure 135, which are in direct contact with each other, are considered as one group, and each group is sandwiched between one of the openings 128" and one of the openings 144.

In addition, the portions 133*a*, 133*b*, 133*c*, 133*d*, 133*e* and 133*f* of the first semiconductor structure 133 each has the same width W2, and the portions 135*a*, 135*b*, 135*c*, 135*d*, 135*e* and 135*f* of the second semiconductor structure 135 each has the same width W3. In some embodiments, the width W2 is substantially the same as the width W3. Furthermore, each opening 144 has the same width W1, and each opening 128" has the same width W4. In some embodiments, the width W1 is substantially the same as the width W4. In some embodiments, the width W1 is twice the width W2, and the width W4 is twice the width W3. In some embodiments, the W1:W2:W3:W4 ratio is about 2:1:1:2.

In some embodiments, the portions 133*a*, 133*b*, 133*c*, 133*d*, 133*e* and 133*f* of the first semiconductor structure 133 are made of a first semiconductor material, the portions 135*a*, 135*b*, 135*c*, 135*d*, 135*e* and 135*f* of the second semiconductor structure 135 are made of a second semiconductor material, and the first semiconductor material is different from the second semiconductor material. For example, the first semiconductor material includes silicon (Si) or silicon germanium (SiGe), and the second semiconductor material includes germanium (Ge). Since the first semiconductor structure 133 and the second semiconductor structure 135 are made of different materials, which collectively form a composite hard mask, the first semiconductor structure 133 and the second semiconductor structure 135 can be utilized in subsequent etching process(es) to remove undesired portions of the underlying first and second dielectric layers 105 and 103.

Figure 2:
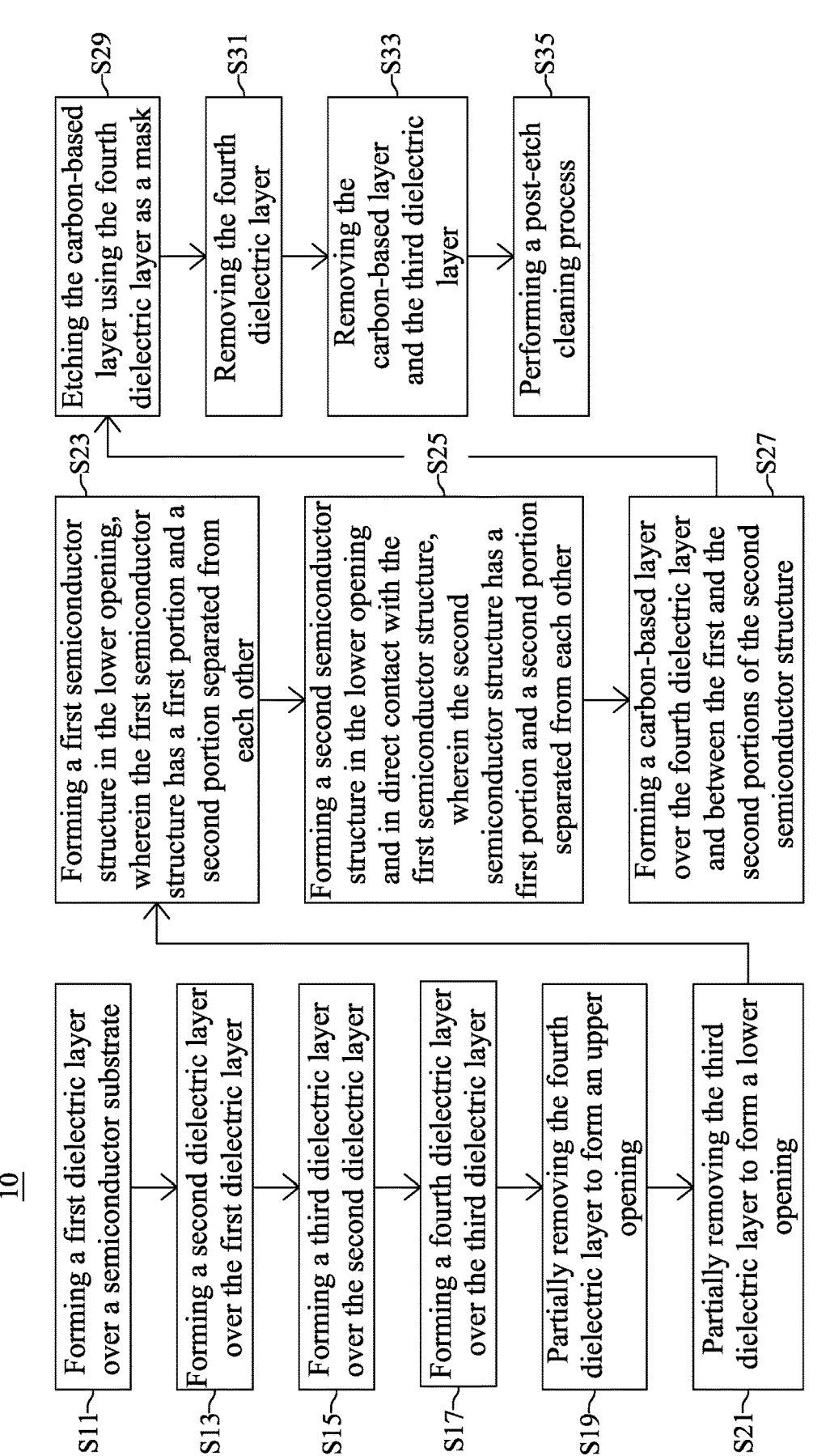
FIG. 2 is a flow diagram illustrating a method for preparing a semiconductor device structure, in accordance with some embodiments.

FIG. 2 is a flow diagram illustrating a method 10 for preparing a semiconductor device structure 100, and the method 10 includes steps S11, S13, S15, S17, S19, S21, S23, S25, S27, S29, S31, S33, and S35, in accordance with some embodiments. The steps S11 to S35 of FIG. 2 are elaborated in connection with the following figures.

Figure 3:
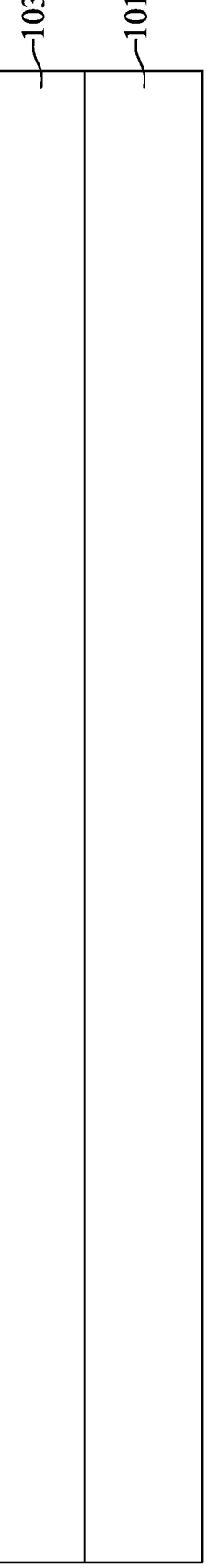
FIG. 3 is a cross-sectional view illustrating an intermediate stage of forming a first dielectric layer over a semiconductor substrate during the formation of the semiconductor device structure, in accordance with some embodiments.

FIGS. 3-19 are cross-sectional views illustrating intermediate stages of forming the semiconductor device structure 100, in accordance with some embodiments. As shown in FIG. 3, a semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A first dielectric layer 103 is formed over the semiconductor substrate 101, as shown in FIG. 3 in accordance with some embodiments. The respective step is illustrated as the step S11 in the method 10 shown in FIG. 2. In some embodiments, the first dielectric layer 103 is made of or includes silicon dioxide ($SiO_2$), although other materials, such as silicon nitride, silicon oxynitride, borosilicate glass (BSG), borophosphosilicate glass (BPSG), tetraethoxysilane (TEOS), or the like may alternatively be utilized. The first dielectric layer 103 may be formed by a deposition process, such as a chemical vapor deposition (CVD) process, a physical vapor deposition (PVD) process, an atomic layer deposition (ALD) process, a spin-on coating process, or another suitable method.

Figure 4:
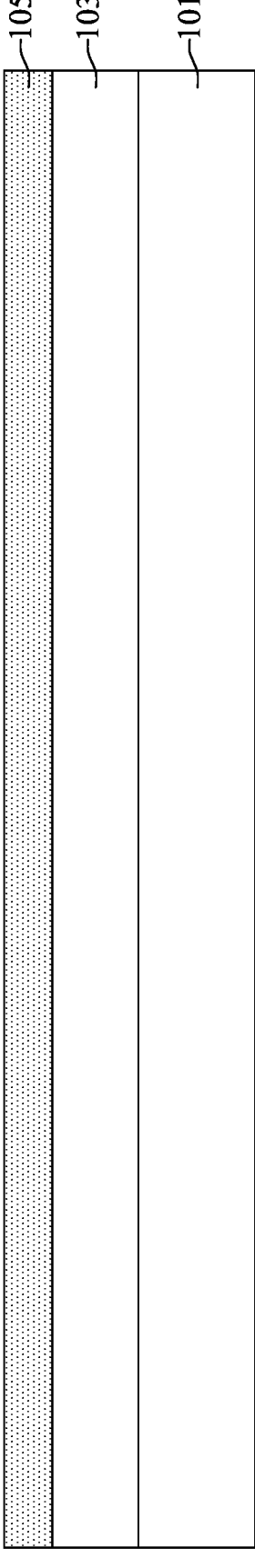
FIG. 4 is a cross-sectional view illustrating an intermediate stage of forming a second dielectric layer over the first dielectric layer during the formation of the semiconductor device structure, in accordance with some embodiments.

Next, a second dielectric layer 105 is formed over the first dielectric layer 103, as shown in FIG. 4 in accordance with some embodiments. The respective step is illustrated as the step S13 in the method 10 shown in FIG. 2. In some embodiments, the second dielectric layer 105 is made of or includes silicon nitride ($Si_3N_4$), although other materials, such as silicon oxide, silicon oxynitride, borosilicate glass (BSG), borophosphosilicate glass (BPSG), tetraethoxysilane (TEOS), or the like may alternatively be utilized. In some embodiments, the second dielectric layer 105 and the first dielectric layer 103 are made of or include different materials. Some processes used to form the second dielectric layer 105 are similar to, or the same as, those used to form the first dielectric layer 103, and details thereof are not repeated herein.

Figure 5:
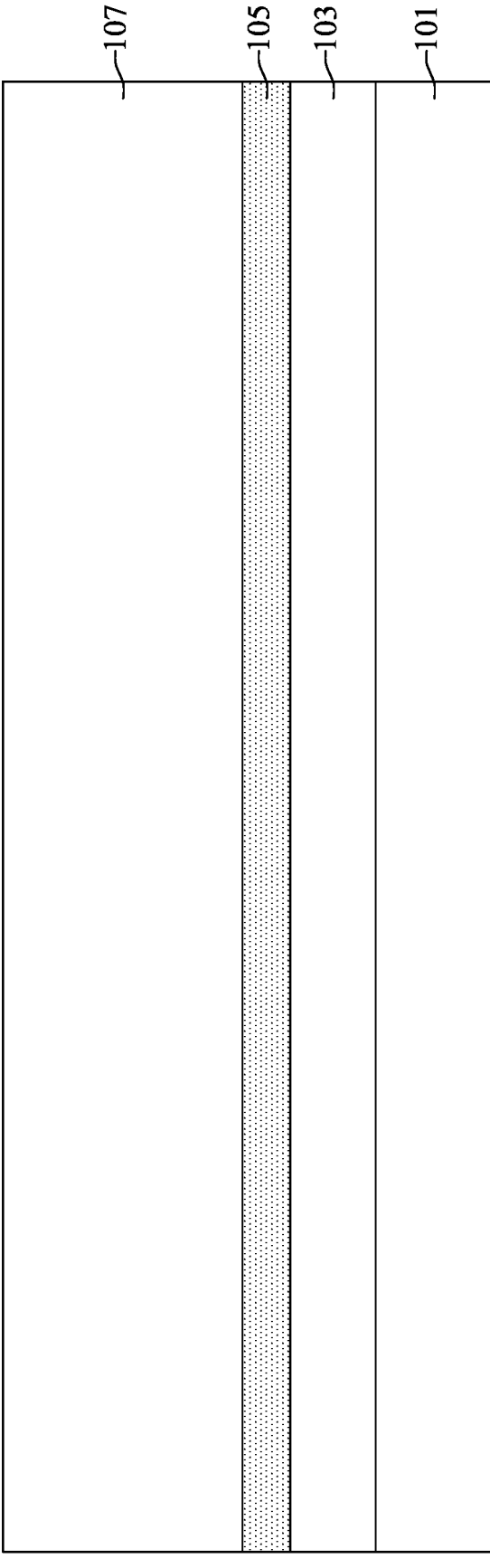
FIG. 5 is a cross-sectional view illustrating an intermediate stage of forming a third dielectric layer over the second dielectric layer during the formation of the semiconductor device structure, in accordance with some embodiments.

Subsequently, a third dielectric layer 107 is formed over the second dielectric layer 105, as shown in FIG. 5 in accordance with some embodiments. The respective step is illustrated as the step S15 in the method 10 shown in FIG. 2. In some embodiments, the third dielectric layer 105 is made of or includes silicon dioxide ($SiO_2$), although other materials, such as silicon nitride, silicon oxynitride, borosilicate glass (BSG), borophosphosilicate glass (BPSG), tetraethoxysilane (TEOS), or the like may alternatively be utilized.

In some embodiments, the third dielectric layer 107 and the second dielectric layer 105 are made of or include different materials. In some embodiments, the third dielectric layer 107 and the first dielectric layer 103 are made of or include the same material. Some processes used to form the third dielectric layer 107 are similar to, or the same as, those used to form the first dielectric layer 103, and details thereof are not repeated herein.

Figure 6:
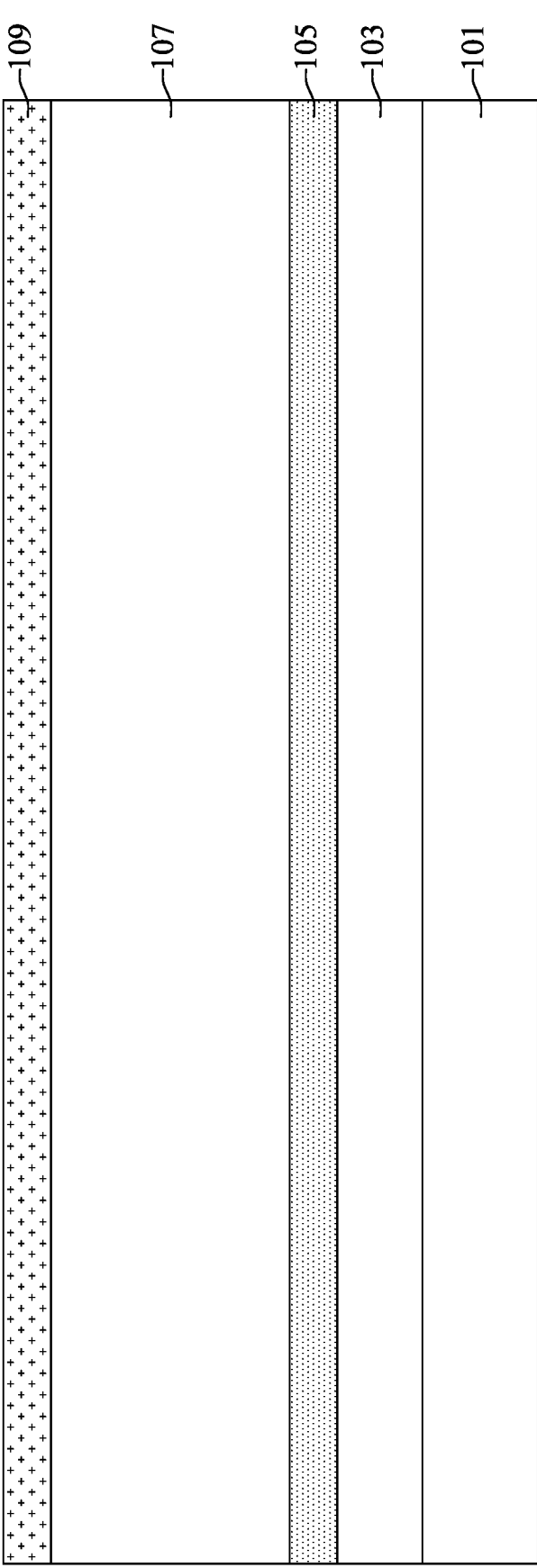
FIG. 6 is a cross-sectional view illustrating an intermediate stage of forming a fourth dielectric layer over the third dielectric layer during the formation of the semiconductor device structure, in accordance with some embodiments.

Then, a fourth dielectric layer 109 is formed over the third dielectric layer 107, as shown in FIG. 6 in accordance with some embodiments. The respective step is illustrated as the step S17 in the method 10 shown in FIG. 2. In some embodiments, the second dielectric layer 105 is made of or includes silicon nitride (Si$_3$N$_4$), although other materials, such as silicon oxide, silicon oxynitride, borosilicate glass (BSG), borophosphosilicate glass (BPSG), tetraethoxysilane (TEOS), or the like may alternatively be utilized.

In some embodiments, the fourth dielectric layer 109 and the third dielectric layer 107 are made of or include different materials. In some embodiments, the fourth dielectric layer 109 and the second dielectric layer 105 are made of or include the same material. Some processes used to form the fourth dielectric layer 109 are similar to, or the same as, those used to form the first dielectric layer 103, and details thereof are not repeated herein.

Figure 7:
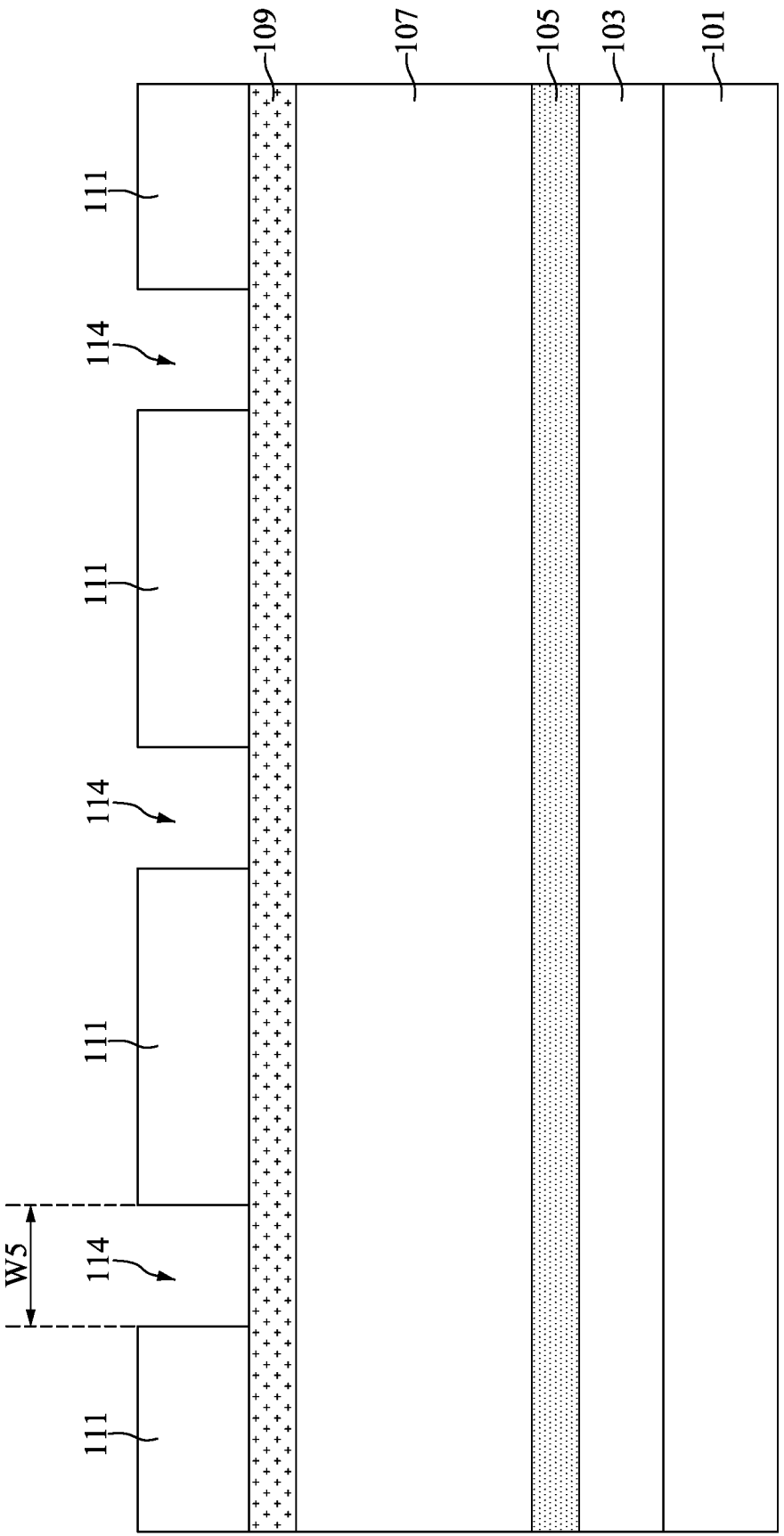
FIG. 7 is a cross-sectional view illustrating an intermediate stage of forming a patterned mask over the fourth dielectric layer during the formation of the semiconductor device structure, in accordance with some embodiments.

Next, a patterned mask 111 with a plurality of openings 114 is formed over the fourth dielectric layer 109, as shown in FIG. 7 in accordance with some embodiments. In some embodiments, each opening 114 has the same width W5. In some embodiments, the fourth dielectric layer 109 is partially exposed by the openings 114. In some embodiments, the fourth dielectric layer 109 and the patterned mask 111 include different materials so that the etching selectivities may be different in the subsequent etching process.

Figure 8:
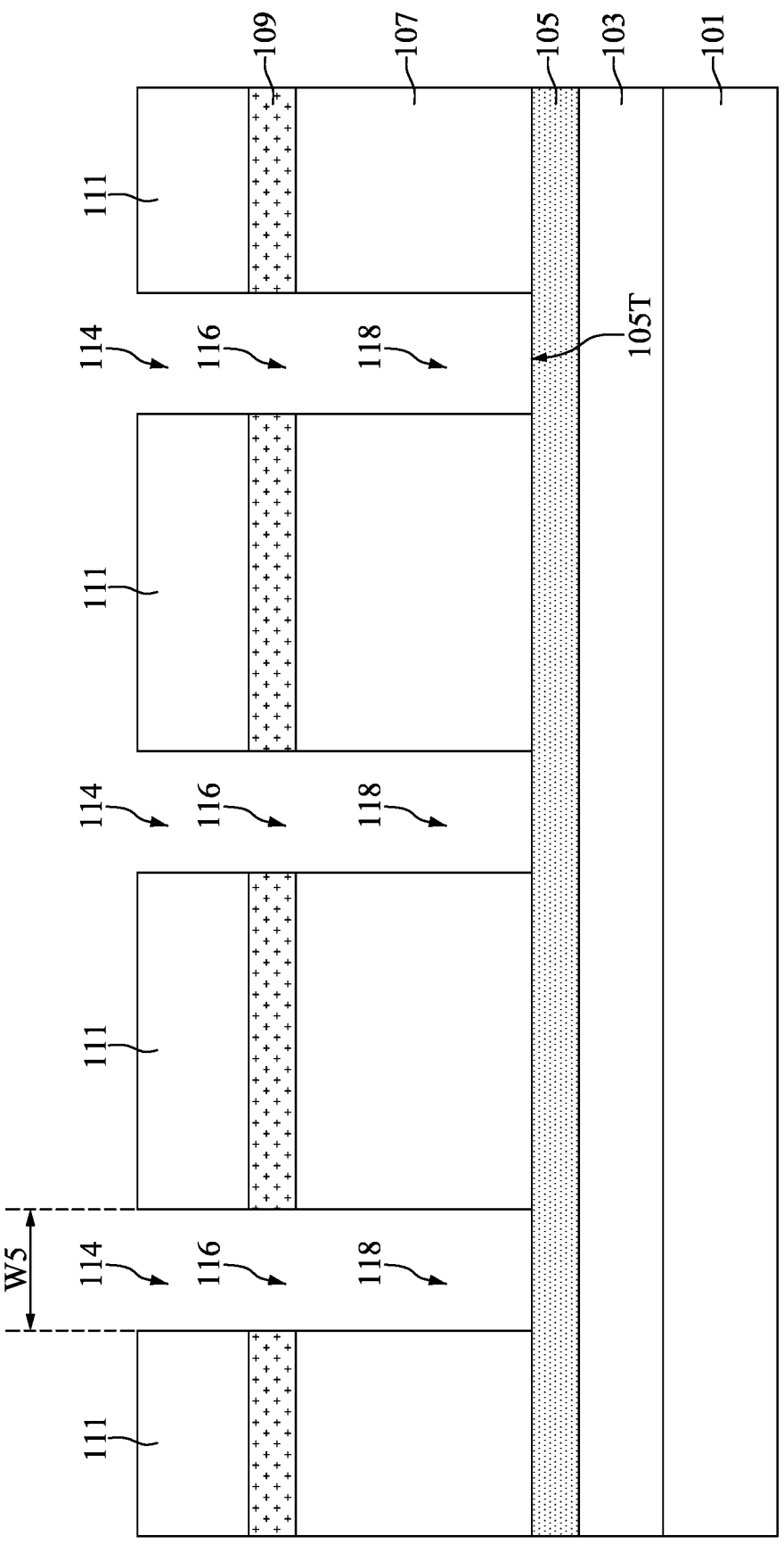
FIG. 8 is a cross-sectional view illustrating an intermediate stage of etching the third dielectric layer and the fourth dielectric layer using the patterned mask as a mask during the formation of the semiconductor device structure, in accordance with some embodiments.

Subsequently, an etching process is performed using the patterned mask 111 as a mask, such that openings 116 and 118 are formed in the fourth dielectric layer 109 and the third dielectric layer 107, as shown in FIG. 8 in accordance with some embodiments. In some embodiments, each of the openings 116 penetrates through the fourth dielectric layer 109. In some embodiments, each of the openings 118 penetrates through the third dielectric layer 107, such that the top surface 105T of the second dielectric layer 105 is partially exposed by the openings 118. At this stage, each opening 116 and each opening 118 have the same width W5. In some embodiments, the etching process for forming the openings 116 and 118 includes a wet etching process, a dry etching process, or a combination thereof.

Figure 9:
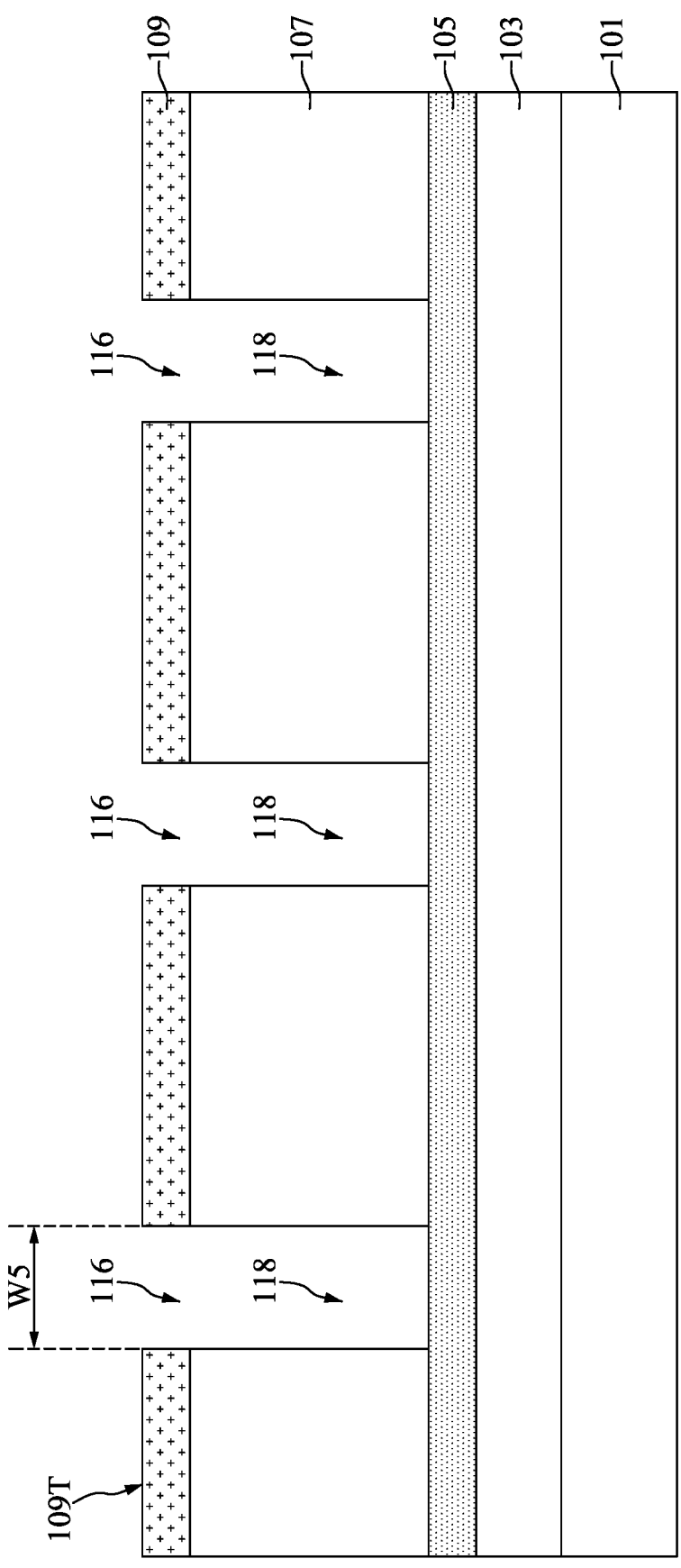
FIG. 9 is a cross-sectional view illustrating an intermediate stage of removing the patterned mask during the formation of the semiconductor device structure, in accordance with some embodiments.

After the openings 116 and 118 are formed, the patterned mask 111 is removed, as shown in FIG. 9 in accordance with some embodiments. In some embodiments, the patterned mask 111 is removed by a stripping process, an ashing process, an etching process, or another suitable method. After the patterned mask 111 is removed, the top surface 109T of the fourth dielectric layer 109 is exposed.

Figure 10:
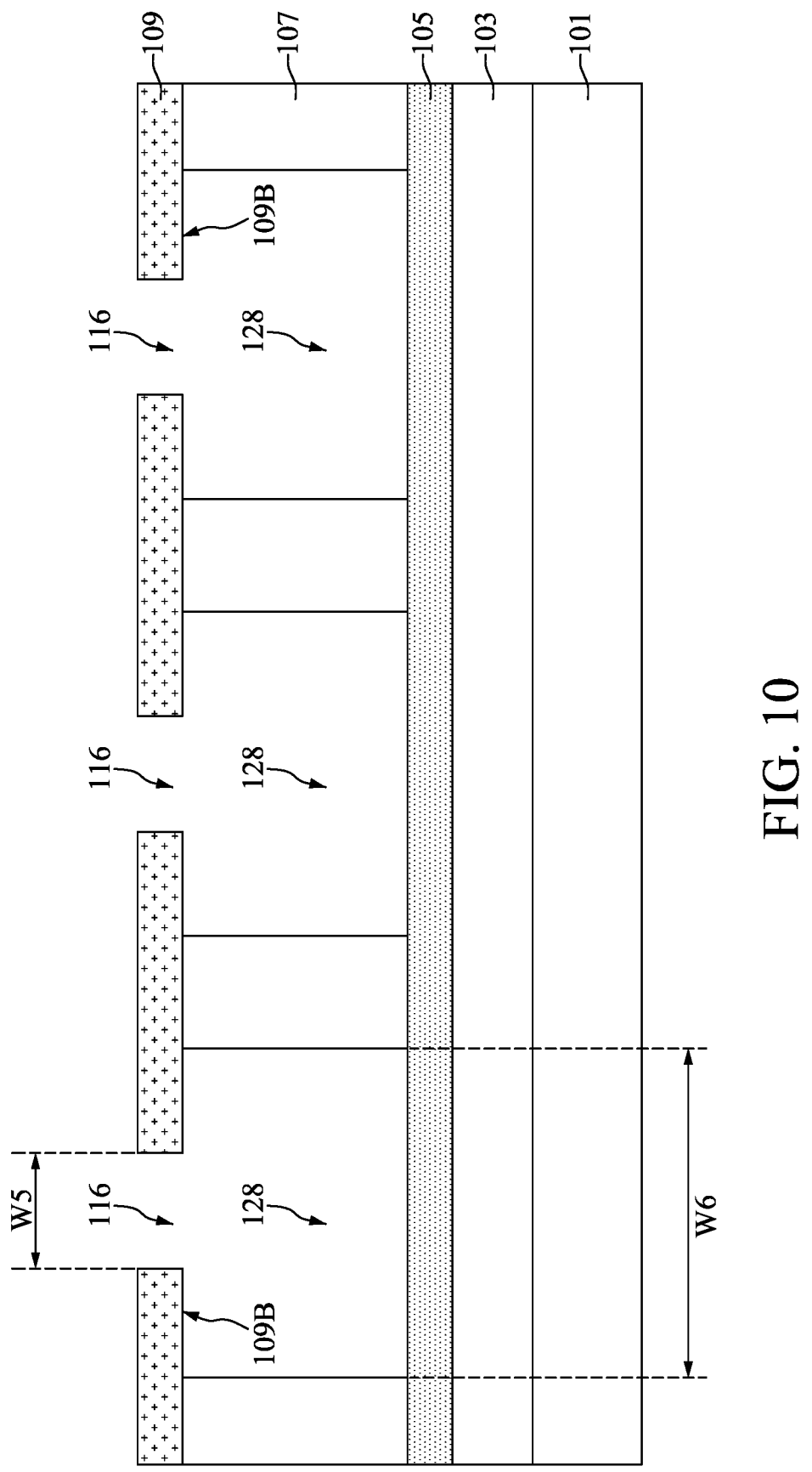
FIG. 10 is a cross-sectional view illustrating an intermediate stage of laterally etching the third dielectric layer during the formation of the semiconductor device structure, in accordance with some embodiments.

Then, the third dielectric layer 107 is laterally etched through the openings 116 in the fourth dielectric layer 109 to form a plurality of enlarged openings 128 in the third dielectric layer 107, as shown in FIG. 10 in accordance with some embodiments. In some embodiments, the fourth dielectric layer 109 remains intact during the laterally etching of the third dielectric layer 107. After the third dielectric layer 128 is laterally etched, each of the openings 128 has a width W6 greater than the width W5 of the opening 116, in accordance with some embodiments.

In some embodiments, the openings 116 in the fourth dielectric layer 109 are referred to as the upper openings, and the openings 128 in the third dielectric layer 107 are referred to as the lower openings. The respective steps are illustrated as the steps S19 and S21 in the method 10 shown in FIG. 2. In some embodiments, the bottom surface 109B of the fourth dielectric layer 109 is partially exposed by the openings 128. In some embodiments, the etching process for forming the openings 128 includes a wet etching process, a dry etching process, or a combination thereof. In some embodiments, the etching process for forming the opening 128 includes an isotropic etching process, and the etching process has a relatively high etching selectivity of the third dielectric layer 107 to the fourth dielectric layer 109 and the second dielectric layer 105.

Figure 11:
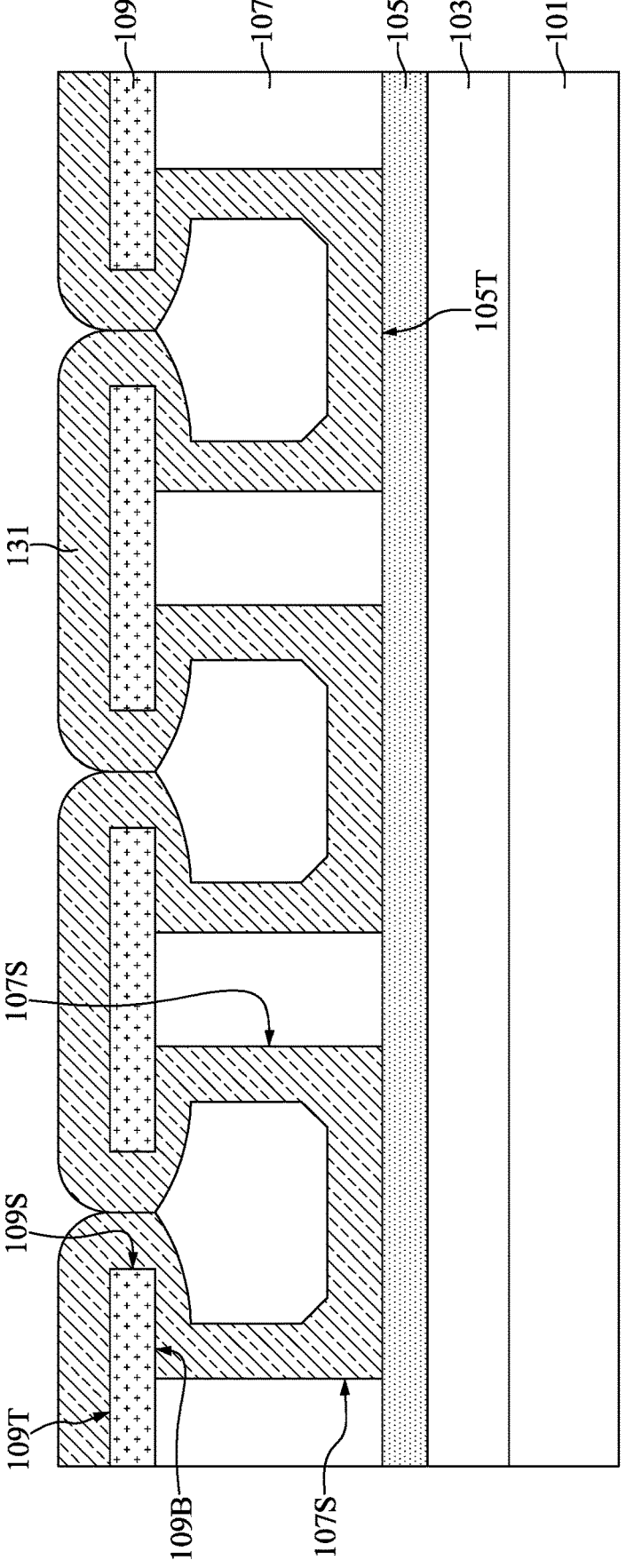
FIG. 11 is a cross-sectional view illustrating an intermediate stage of depositing a first semiconductor layer during the formation of the semiconductor device structure, in accordance with some embodiments.

Next, a first semiconductor layer 131 is deposited over the fourth dielectric layer 109, as shown in FIG. 11 in accordance with some embodiments. In some embodiments, the first semiconductor layer 131 extends into the upper opening 116 and the lower opening 128. In some embodiments, the lower opening 128 is partially filled by the first semiconductor layer 131.

In some embodiments, the first semiconductor layer 131 covers the top surface 109T, the sidewalls 109S and the bottom surface 109B of the fourth dielectric layer 109, the sidewall 107S of the third dielectric layer 107, and the top surface 105T of the second dielectric layer 105. In some embodiments, the first semiconductor layer 131 includes silicon (Si), such as polysilicon, or silicon germanium (SiGe). In some embodiments, the first semiconductor layer 131 is formed by a deposition process, such as an ALD process.

Figure 12:
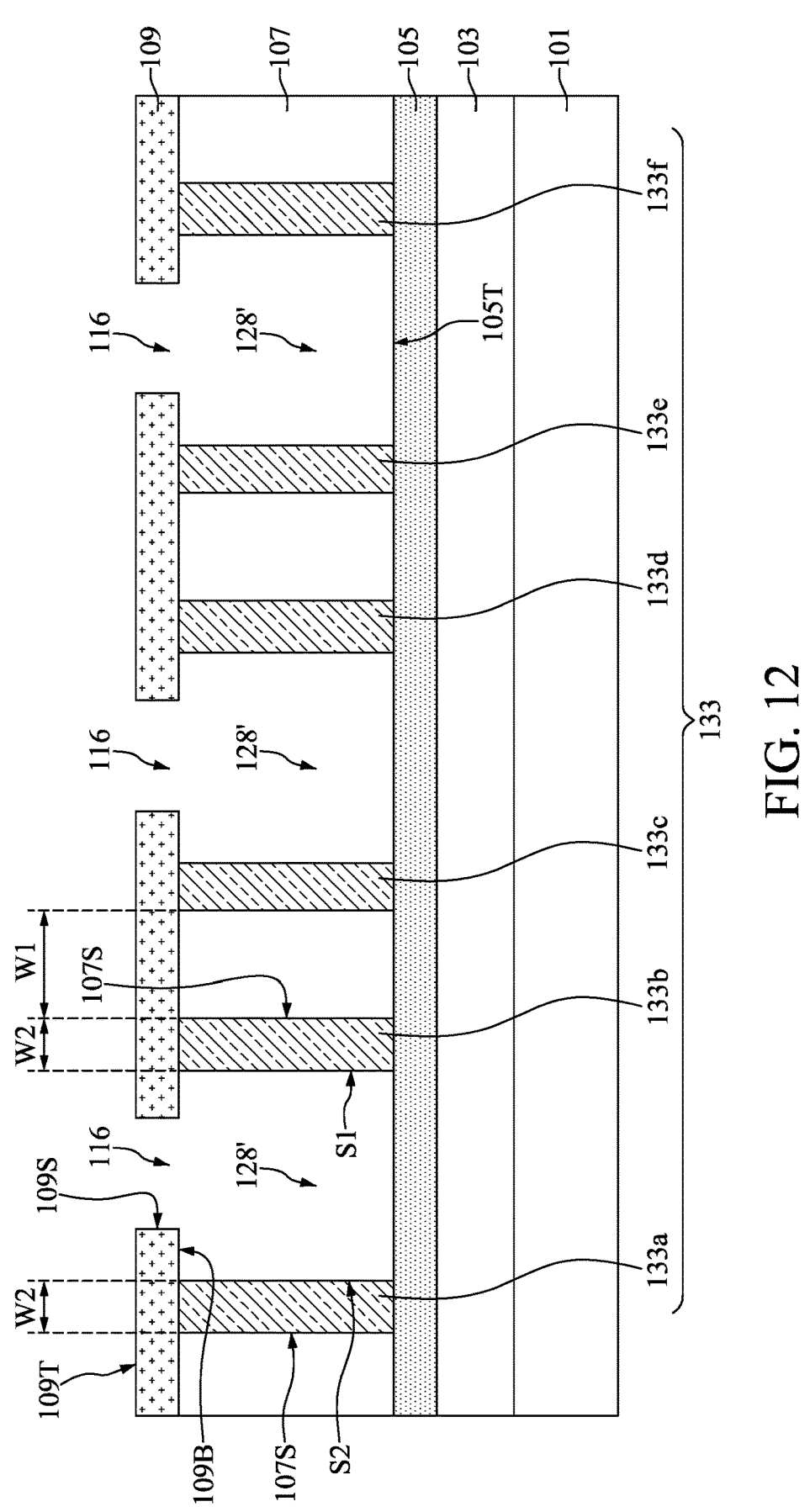
FIG. 12 is a cross-sectional view illustrating an intermediate stage of partially removing the first semiconductor layer to form a first semiconductor structure over the second dielectric layer during the formation of the semiconductor device structure, in accordance with some embodiments.

Subsequently, an etching process is performed on the first semiconductor layer 131 such that remaining portions of the first semiconductor layer 131 collectively form a first semiconductor structure 133, as shown in FIG. 12 in accordance with some embodiments. In some embodiments, after the etching process, the top surface 109T and the sidewalls 109S of the fourth dielectric layer 109 are fully exposed, the bottom surface 109B of the fourth dielectric layer 109 and the top surface 105T of the second dielectric layer 105T are partially exposed, while the sidewalls 107S of the third dielectric layer 107 remain covered. In some embodiments, the sidewalls 107S of the third dielectric layer 107 are fully covered by the first semiconductor structure 133.

In some embodiments, the first semiconductor structure 133 includes portions 133a, 133b, 133c, 133d, 133e and 133f, which are the remaining portions after the etching process. The portions 133a and 133b are separated from each other by one of the openings 128'(i.e., the remaining portion of the respective opening 128). The respective step is illustrated as the step S23 in the method 10 shown in FIG. 2. Moreover, in some embodiments, the sidewall S1 of the portion 133b of the first semiconductor structure 133 faces the sidewall S2 of the portion 133a of the first semiconductor structure 133. In other words, the sidewalls S1 and S2 are exposed by the same opening 128'. Similar features also present between the portions 133c and 133d of the first semiconductor structure 133, and between the portions 133e and 133f of the first semiconductor structure 133, and are not repeated herein.

In some embodiments, the portions 133a, 133b, 133c, 133d, 133e and 133f of the first semiconductor structure 133 are covered by the bottom surface 109B of the fourth dielectric layer 109. Still referring to FIG. 12, a portion of the third dielectric layer 107 is sandwiched between the portions 133*b* and 133*c* of the first semiconductor structure 133, and the portion of the third dielectric layer 107 has a width W1, in accordance with some embodiments. In some embodiments, the portions 133*a* and 133*b* each has the same width W2, and the width W1 is twice the width W2. In some embodiments, the etching process for forming the first semiconductor structure 133 includes a wet etching process, a dry etching process, or a combination thereof.

Figure 13:
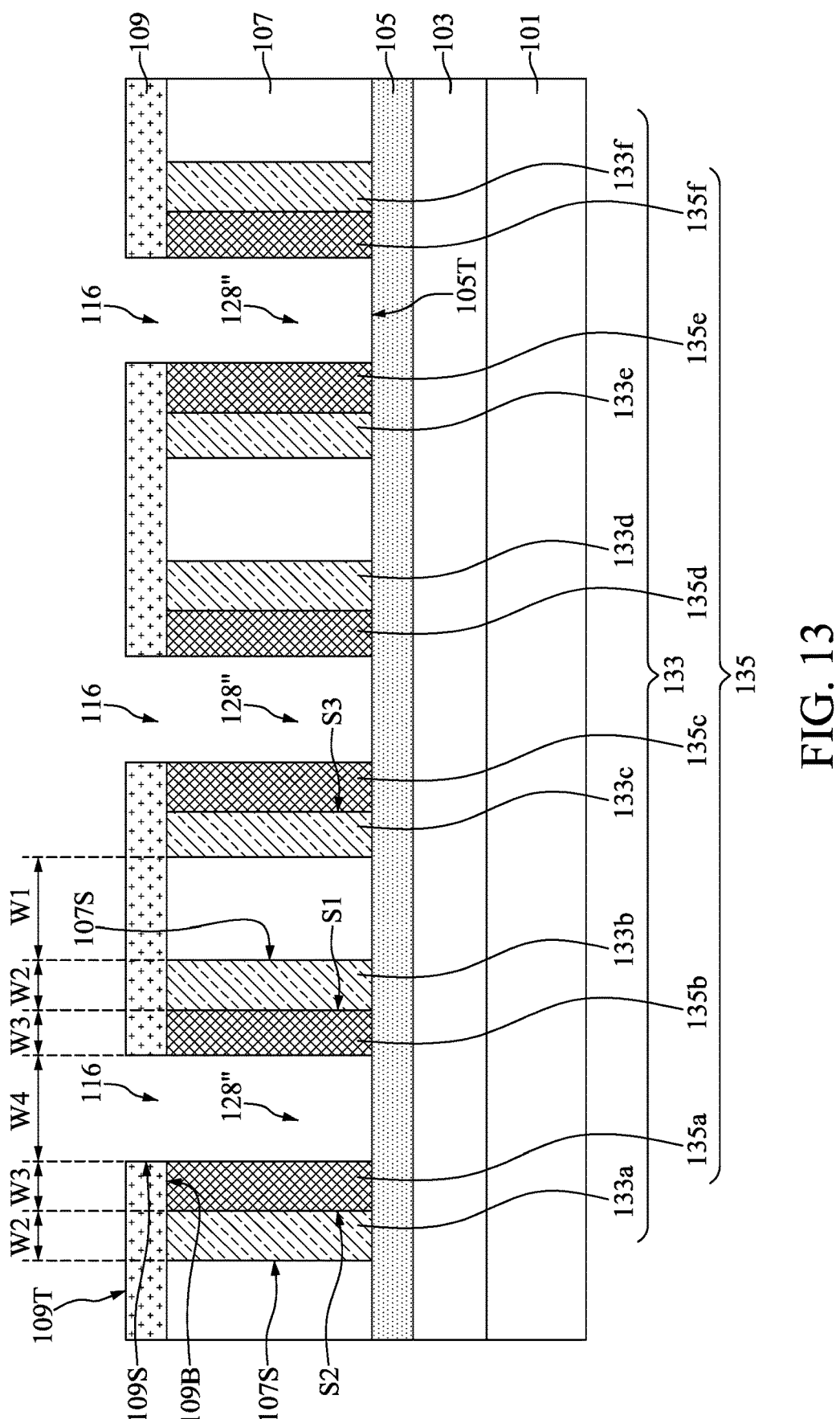
FIG. 13 is a cross-sectional view illustrating an intermediate stage of forming a second semiconductor structure over the second dielectric layer and in direct contact with the first semiconductor structure during the formation of the semiconductor device structure, in accordance with some embodiments.

Then, a second semiconductor structure 135 is formed in the openings 128' and in direct contact with the first semiconductor structure 133, as shown in FIG. 13 in accordance with some embodiments. In some embodiments, the second semiconductor structure 135 includes portions 135*a*, 135*b*, 135*c*, 135*d*, 135*e* and 135*f*. In some embodiments, the portions 135*a*, 135*b*, 135*c*, 135*d*, 135*e* and 135*f* are formed on the exposed sidewalls of the portions 133*a*, 133*b*, 133*c*, 133*d*, 133*e* and 133*f* of the first semiconductor structure 133. For example, the portion 135*a* is formed on the sidewall S2 of the portion 133*a*, the portion 135*b* is formed on the sidewall S1 of the portion 133*b*, and the portion 135*c* is formed on the sidewall S3 of the portion 133*c*.

Moreover, in some embodiments, the portions 135*a* and 135*b* are separated from each other by one of the openings 128" (i.e., the remaining portion of the respective opening 128'). The respective step is illustrated as the step S25 in the method 10 shown in FIG. 2. Similar features also present between the portions 135*c* and 135*d* of the second semiconductor structure 135, and between the portions 135*e* and 135*f* of the second semiconductor structure 135, and are not repeated herein.

In some embodiments, after the second semiconductor structure 135 is formed, the top surface 109T and the sidewalls 109S of the fourth dielectric layer 109 are fully exposed, while the bottom surface 109B of the fourth dielectric layer 109 is fully covered. In some embodiments, the top surface 105T of the second dielectric layer 105 is partially exposed by the openings 128". In some embodiments, the portions 135*a* and 135*b* each has the same width W3, and the width W4 of the opening 128" is twice the width W3. In addition, the width W2 is the same as the width W3, and the width W1 is the same as the width W4, in accordance with some embodiments.

In some embodiments, the second semiconductor structure 135 includes germanium (Ge). In some embodiments, the second semiconductor structure 135 is formed by an epitaxial growing process, such as a CVD process, a molecular beam epitaxy (MBE) process, or another suitable process. In some embodiments, the second semiconductor structure 135 is selectively grown over the exposed surfaces of the first semiconductor structure 133 (i.e., the exposed sidewalls of the first semiconductor structure 133 shown in FIG. 12).

Figure 14:
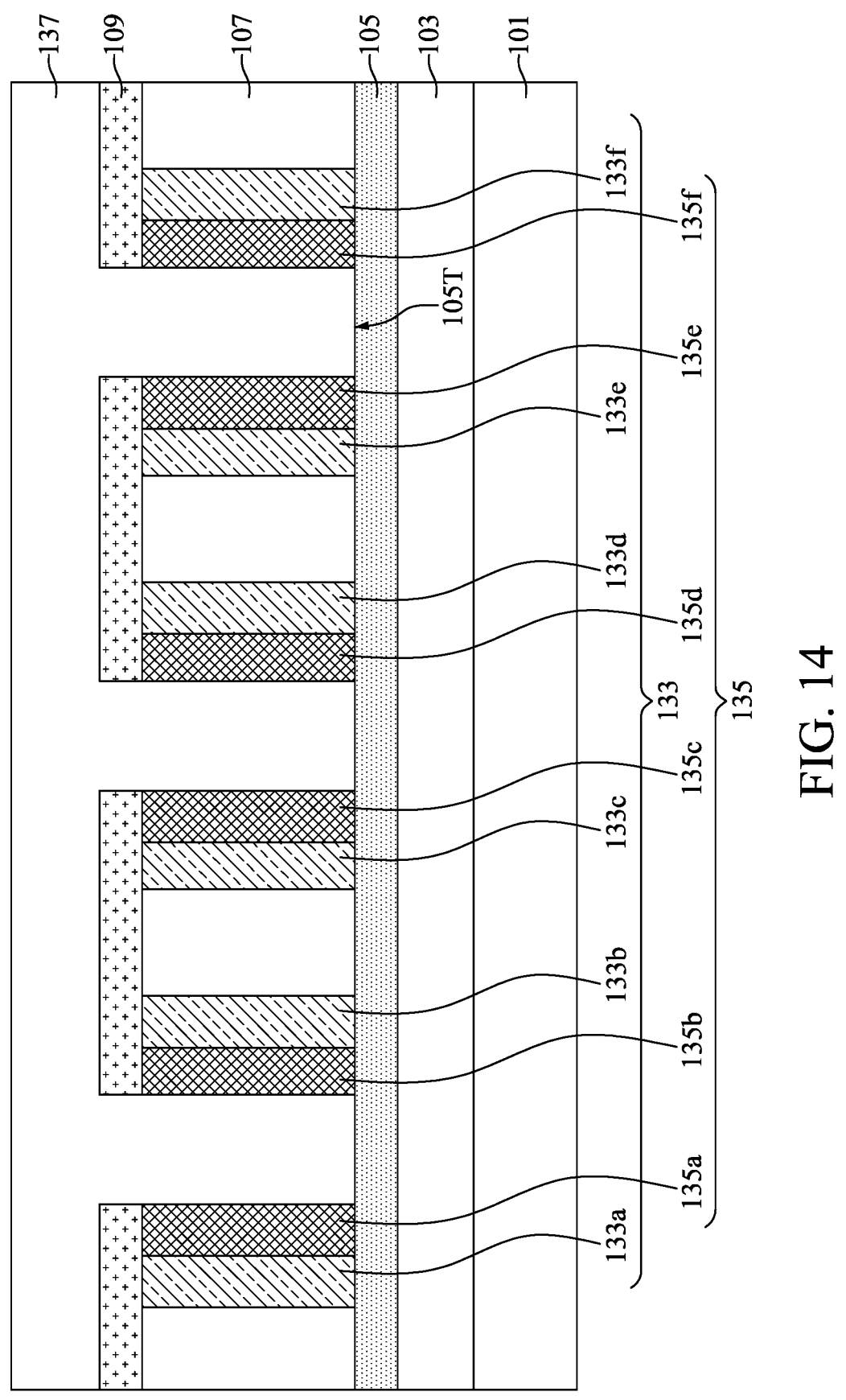
FIG. 14 is a cross-sectional view illustrating an intermediate stage of forming a carbon-based layer over the fourth dielectric layer during the formation of the semiconductor device structure, in accordance with some embodiments.

Next, a carbon-based layer 137 is formed over the fourth dielectric layer 109, as shown in FIG. 14 in accordance with some embodiments. In some embodiments, the top surface 109T and the sidewalls 109S of the fourth dielectric layer 109 (see FIG. 13) are covered by the carbon-based layer 137, and the upper openings 116 and the lower openings 128" (see FIG. 13) are filled by the carbon-based layer 137. The respective step is illustrated as the step S27 in the method 10 shown in FIG. 2. The carbon-based layer 137 may be formed by a deposition process, such as a CVD process, a PVD process, an ALD process, a spin-on coating process, or another suitable method.

Figure 15:
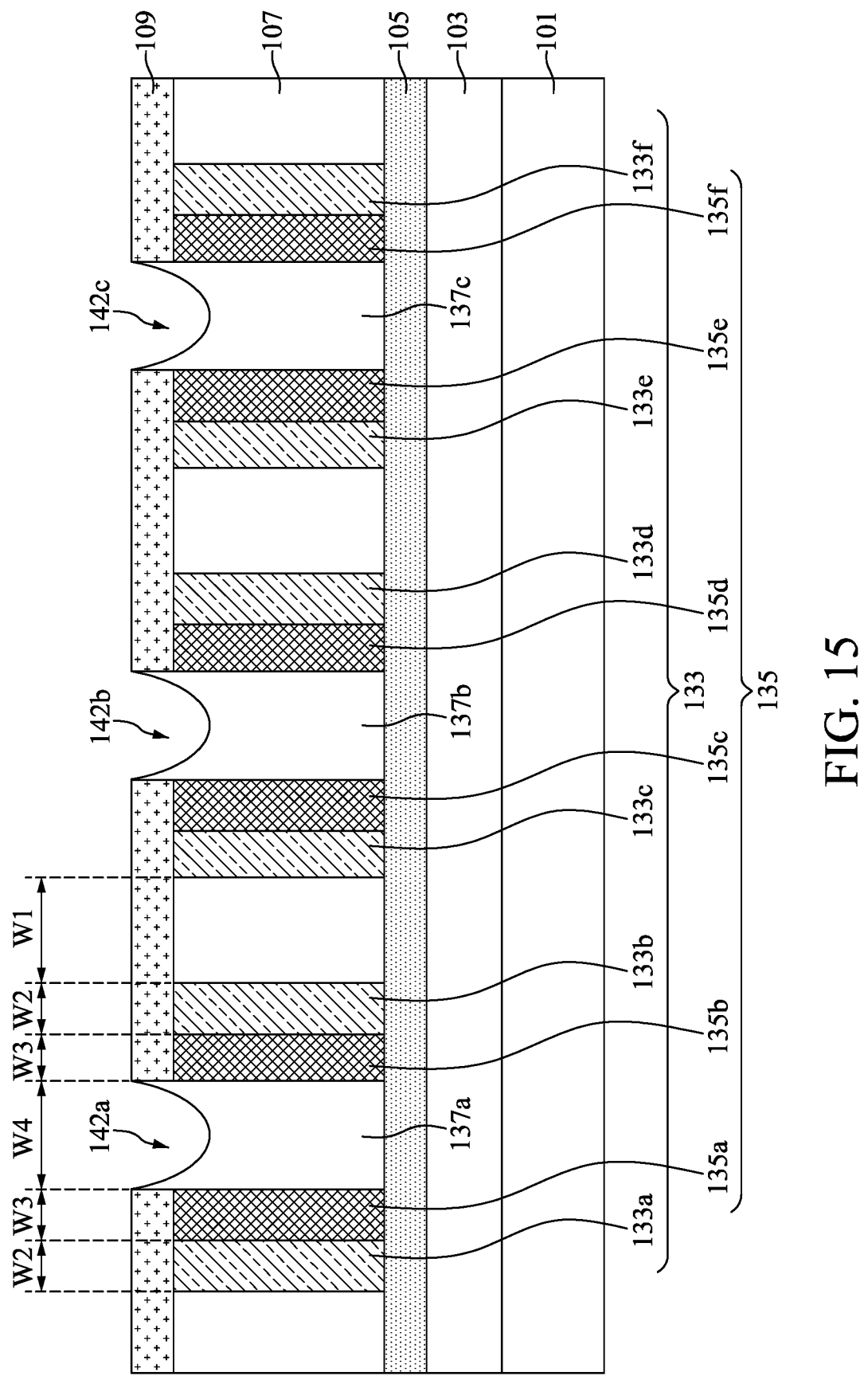
FIG. 15 is a cross-sectional view illustrating an intermediate stage of etching the carbon-based layer using the fourth dielectric layer as a mask during the formation of the semiconductor device structure, in accordance with some embodiments.

Subsequently, an etching process is performed on the carbon-based layer 137 using the fourth dielectric layer 109 as a mask, as shown in FIG. 15 in accordance with some embodiments. The respective step is illustrated as the step S29 in the method 10 shown in FIG. 2. In some embodiments, the carbon-based layer 137 is partially removed, such that recesses 142*a*, 142*b* and 142*c* are formed over the remaining portions of the carbon-based layer 137*a*, 137*b* and 137*c*, respectively.

In some embodiments, the remaining portion of the carbon-based layer 137*a* is sandwiched between and in direct contact with the portions 135*a* and 135*b* of the second semiconductor structure 135, and the remaining portion of the carbon-based layer 137*a* has a width W4. As mentioned above, the width W4 is twice the width W3, and the width W1 is the same as the width W4. In some embodiments, since the width W2 is the same as the width W3, W1:W2:W3:W4 ratio is about 2:1:1:2. In some embodiments, the etching process performed on the carbon-based layer 137 includes a wet etching process, a dry etching process, or a combination thereof.

Figure 16:
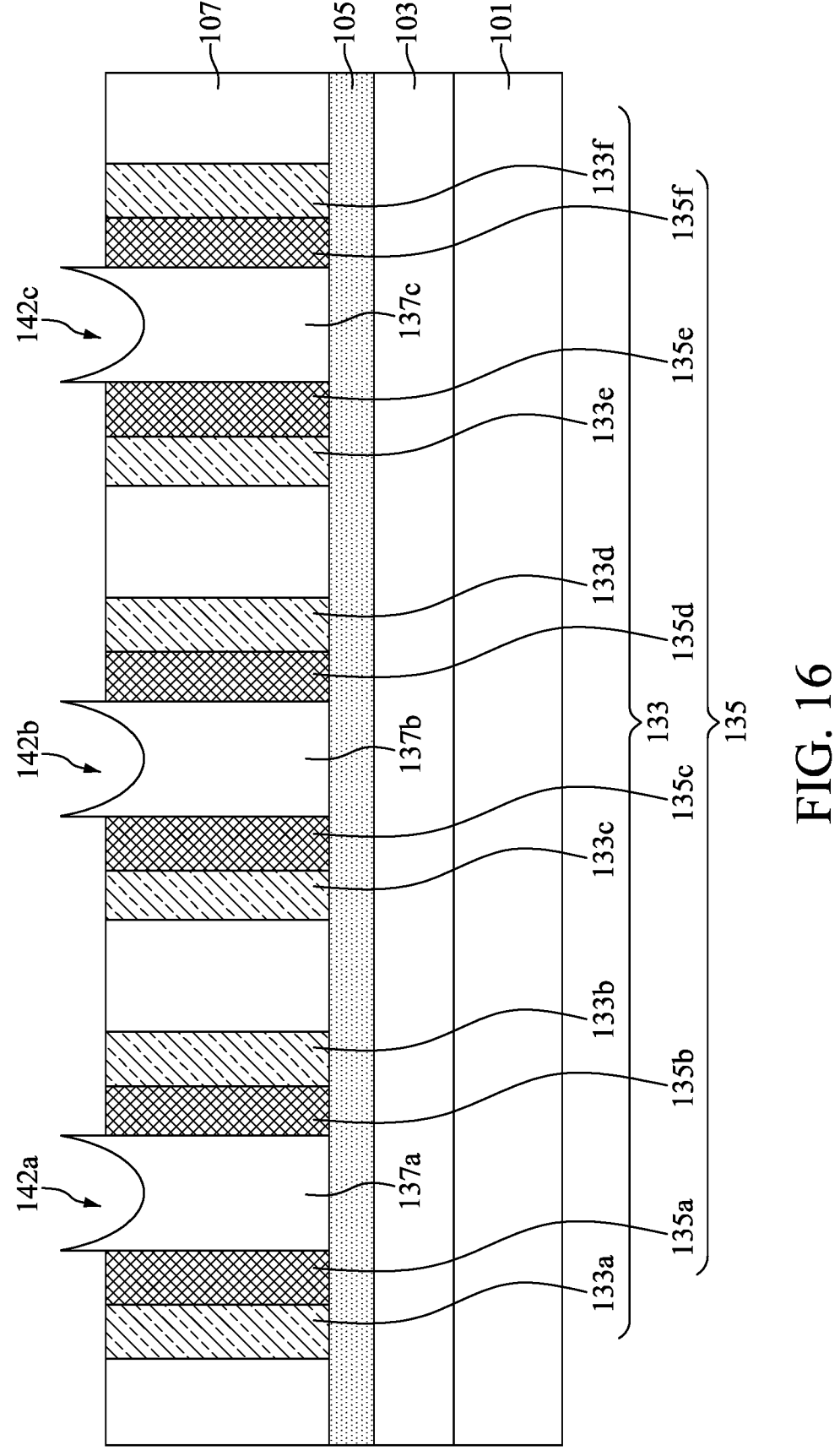
FIG. 16 is a cross-sectional view illustrating an intermediate stage of removing the fourth dielectric layer during the formation of the semiconductor device structure, in accordance with some embodiments.

Then, the fourth dielectric layer 109 is removed, as shown in FIG. 16 in accordance with some embodiments. The respective step is illustrated as the step S31 in the method 10 shown in FIG. 2. In some embodiments, the fourth dielectric layer 109 is removed by an etching process, such as a wet etching process, a dry etching process, or a combination thereof. In some embodiments, the remaining portions of the carbon-based layer 137*a*, 137*b*, and 137*c* are protruded from the third dielectric layer 107, the first semiconductor structure 133 and the second semiconductor structure 135.

Figure 17:
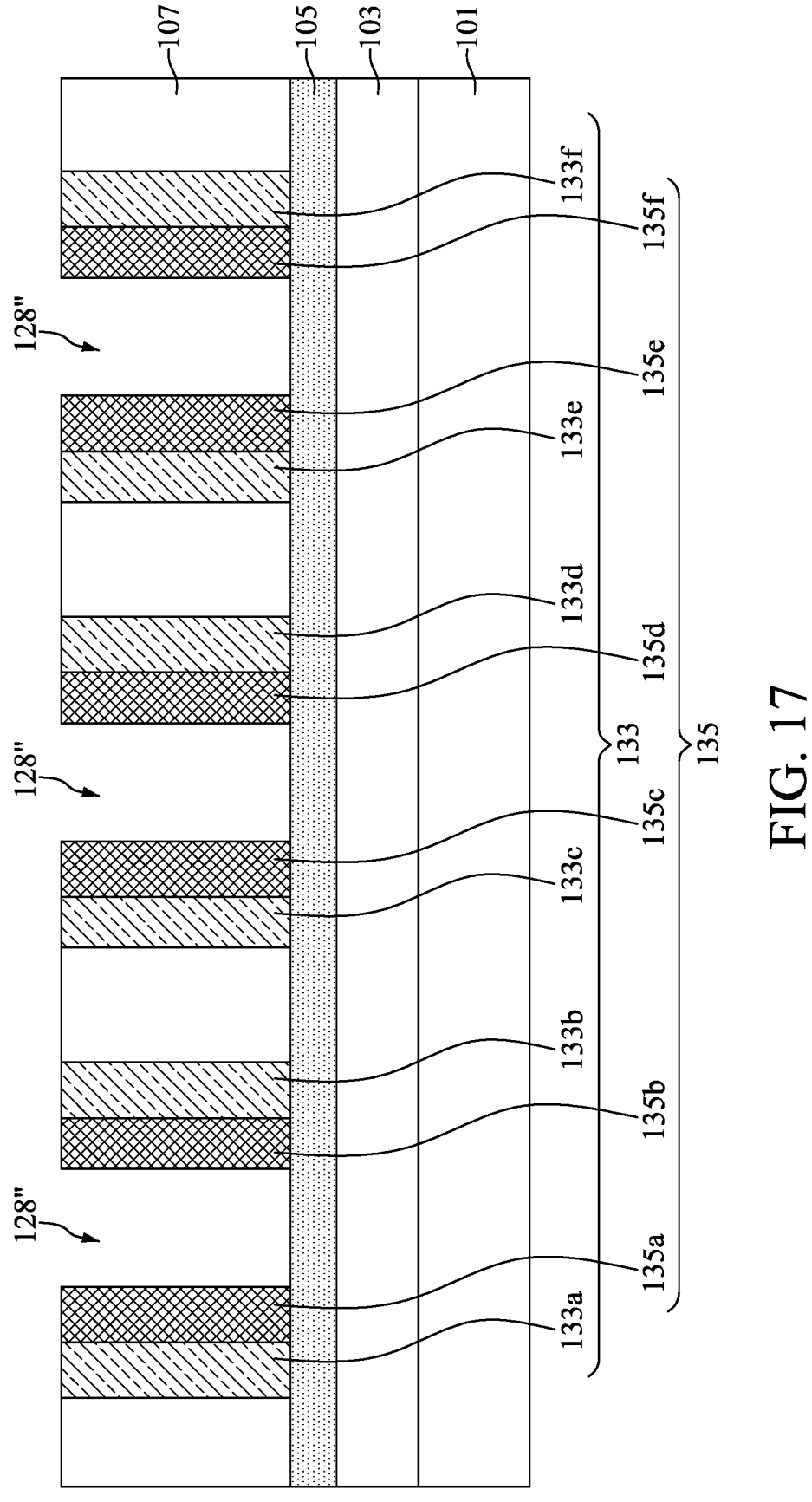
FIG. 17 is a cross-sectional view illustrating an intermediate stage of removing the carbon-based layer during the formation of the semiconductor device structure, in accordance with some embodiments.

Next, the remaining portions of the carbon-based layer 137*a*, 137*b*, and 137*c* are removed, as shown in FIG. 17 in accordance with some embodiments. In some embodiments, the remaining portions of the carbon-based layer 137*a*, 137*b*, and 137*c* are removed by an etching process, such as a wet etching process, a dry etching process, or a combination thereof. After the removal of the remaining portions of the carbon-based layer 137*a*, 137*b*, and 137*c*, the portions 135*a* and 135*b* of the second semiconductor structure 135 are separated from each other by one of the openings 128". Similar features also present between the portions 135*c* and 135*d* of the second semiconductor structure 135, and between the portions 135*e* and 135*f* of the second semiconductor structure 135.

Figure 18:
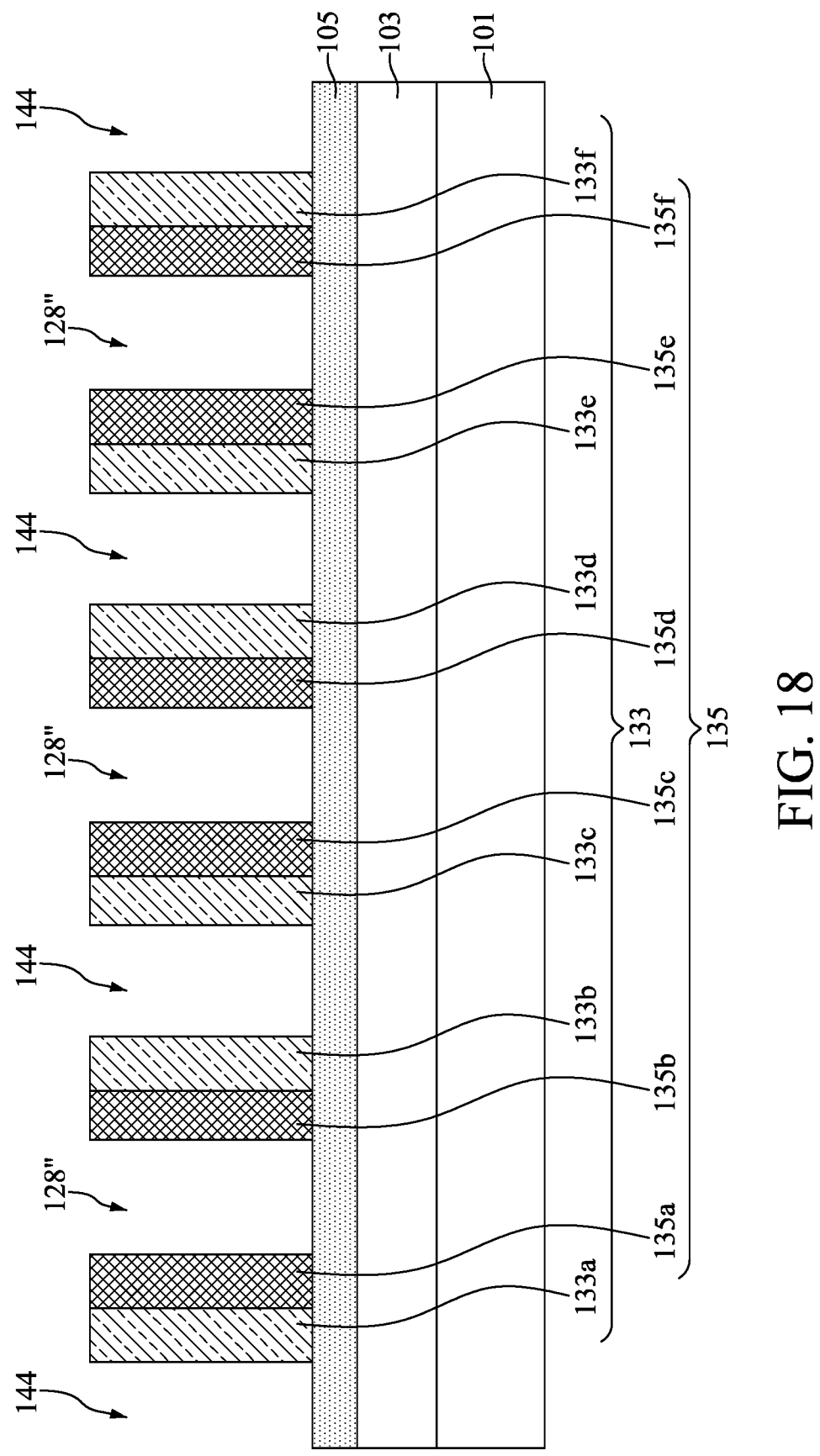
FIG. 18 is a cross-sectional view illustrating an intermediate stage of removing the third dielectric layer during the formation of the semiconductor device structure, in accordance with some embodiments.

Subsequently, the third dielectric layer 107 is removed, as shown in FIG. 18 in accordance with some embodiments. In some embodiments, the third dielectric layer 107 is removed by an etching process, such as a wet etching process, a dry etching process, or a combination thereof. After the removal of the third dielectric layer 107, the portions 133*b* and 133*c* of the first semiconductor structure 133 are separated from each other by one of the openings 144. Similar feature also present between the portions 133*d* and 133*e* of the first semiconductor structure 133.

In the present embodiment, the third dielectric layer 107 and the remaining portions of the carbon-based layer 137*a*, 137*b*, 137*c* are removed separately. In other words, one etching process is performed to remove the remaining portions of the carbon-based layer 137*a*, 137*b*, 137*c*, and another etching process is performed to remove the third dielectric layer 107. However, in some other embodiments, the third dielectric layer 107 and the remaining portions of the carbon-based layer 137*a*, 137*b*, 137*c* are removed by the same etching process step. The respective step is illustrated as the step S33 in the method 10 shown in FIG. 2.

Figure 19:
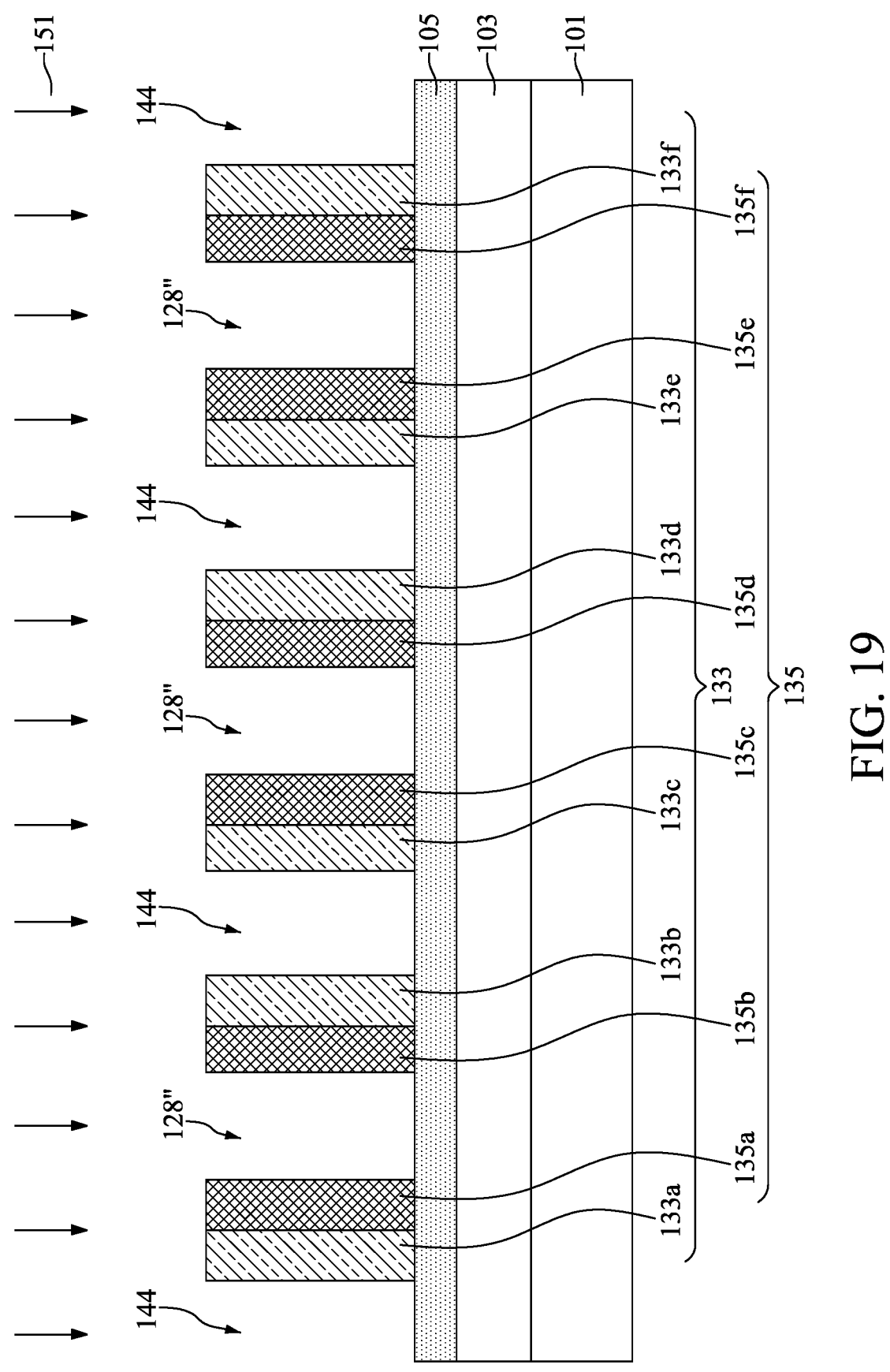
FIG. 19 is a cross-sectional view illustrating an intermediate stage of performing a post-etch cleaning process during the formation of the semiconductor device structure, in accordance with some embodiments.

Subsequently, a post-etch cleaning process 151 is performed to remove the by-products generated in preceding processes, as shown in FIG. 19 in accordance with some embodiments. The respective step is illustrated as the step S35 in the method 10 shown in FIG. 2. In some embodiments, the post-cleaning process 151 includes a wet etching process, and diluted hydrogen fluoride (DHF) is utilized during the post-cleaning process, such that the residues and particles on the exposed surfaces are removed.

After the post-cleaning process 151 is performed, the semiconductor device structure 100 is obtained, as shown in FIG. 1 in accordance with some embodiments.

Embodiments of a semiconductor device structure and method for preparing the same are provided in the disclosure. In some embodiments, the semiconductor device structure 100 includes the first dielectric layer 103 and the second dielectric layer 105 disposed over the semiconductor substrate 101, and the first semiconductor structure 133 and the second semiconductor structure 135 disposed over the second dielectric layer 105. The first semiconductor structure 133 has a plurality of portions (e.g., the portions 133a, 133b, 133c, 133d, 133e and 133f) separated from each other, and the second semiconductor structure 135 has a plurality of portions (e.g., the portions 135a, 135b, 135c, 135d, 135e and 135f) separated from each other. Each of the portions of the first semiconductor structure 133 is in direct contact with each of the portions of the second semiconductor structure 135. The first semiconductor structure 133 and the second semiconductor structure 135 are made of different materials, which collectively form a composite hard mask over the second dielectric layer 105, and the first semiconductor structure 133 and the second semiconductor structure 135 can be utilized in subsequent etching process(es) to remove undesired portions of the first dielectric layer 103 and the second dielectric layer 105. As a result, manufacturing cost and processing time can be reduced, and yield of the semiconductor device structure can be improved.

In one embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first semiconductor structure disposed over the second dielectric layer. The first semiconductor structure has a first portion and a second portion separated from each other by an opening. The semiconductor device structure further includes a second semiconductor structure disposed over the second dielectric layer and in the opening. The second semiconductor structure has a first portion and a second portion separated from each other. Moreover, the first portion of the second semiconductor structure is in direct contact with the first portion of the first semiconductor structure, and the second portion of the second semiconductor structure is in direct contact with the second portion of the first semiconductor structure.

In another embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first semiconductor structure disposed over the second dielectric layer. The first semiconductor structure has a first portion and a second portion separated from each other, and a sidewall of the first portion of the first semiconductor structure is facing a sidewall of the second portion of the first semiconductor structure. The semiconductor device structure further includes a second semiconductor structure disposed over the second dielectric layer. The second semiconductor structure has a first portion and a second portion separated from each other. Moreover, a sidewall of the first portion of the second semiconductor structure adjoins the sidewall of the first portion of the first semiconductor structure, and a sidewall of the second portion of the second semiconductor structure adjoins the sidewall of the second portion of the first semiconductor structure.

In yet another embodiment of the present disclosure, a method for preparing a semiconductor device structure is provided. The method includes forming a first dielectric layer over a semiconductor substrate, and forming a second dielectric layer over the first dielectric layer. The method also includes forming a third dielectric layer over the second dielectric layer, and forming a fourth dielectric layer over the third dielectric layer. The method further includes partially removing the fourth dielectric layer to form an upper opening, and partially removing the third dielectric layer to form a lower opening. A width of the lower opening is greater than a width of the upper opening. In addition, the method includes forming a first semiconductor structure in the lower opening. The first semiconductor structure has a first portion and a second portion covering opposite sidewalls of the lower opening. The method also includes forming a second semiconductor structure between the first portion and the second portion of the first semiconductor structure. The second semiconductor structure has a first portion and a second portion separated from each other. The first portion of the second semiconductor structure is in direct contact with the first portion of the first semiconductor structure, and the second portion of the second semiconductor structure is in direct contact with the second portion of the first semiconductor structure. The method further includes removing the third dielectric layer and the fourth dielectric layer after the first semiconductor structure and the second semiconductor structure are formed.

The embodiments of the present disclosure have some advantageous features. In some embodiment, the semiconductor device structure includes a first semiconductor structure and a second semiconductor structure disposed over a plurality of dielectric layers. The first and the second semiconductor structure are made of different materials, which collectively form a composite hard mask. The composite hard mask can be utilized in subsequent etching process(es) to remove undesired portions of the underlying dielectric layers. As a result, manufacturing cost and processing time can be reduced, and yield of the semiconductor device structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
a first dielectric layer disposed on a top surface of a semiconductor substrate, wherein the first dielectric layer is made of a material adapted to be removed during an etching process;
a second dielectric layer disposed on and in contact with a top surface of the first dielectric layer, wherein the second dielectric layer is made of a material adapted to be removed during the etching process;
a first semiconductor structure disposed over the second dielectric layer, wherein the first semiconductor structure has a first portion, a second portion separated from the first portion, and a third portion separated from the second portion by a first opening; and
a second semiconductor structure disposed over the second dielectric layer, wherein the second semiconductor structure has a first portion, a second portion separated from the first portion by a second opening, and a third portion separated from the second portion, and
wherein the first portion of the second semiconductor structure is in direct contact with the first portion of the first semiconductor structure, the second portion of the second semiconductor structure is in direct contact with the second portion of the first semiconductor structure, and the third portion of the second semiconductor structure is in direct contact with the third portion of the first semiconductor structure;
wherein the first portion and the second portion of the second semiconductor structure are located between the first portion and the second portion of the first semiconductor structure;
wherein the second portion and the third portion of the first semiconductor structure are located between the second portion and the third portion of the second semiconductor structure;
wherein the first semiconductor structure and the second semiconductor structure are made of different materials and collectively form a composite hard mask for being utilized in the etching process for the first dielectric layer and the second dielectric layer.

2. The semiconductor device structure of claim 1, wherein a width of the first portion of the first semiconductor structure is substantially the same as a width of the first portion of the second semiconductor structure, wherein a width of the first opening is the same as a width of the second opening, wherein the width of the second opening is twice the width of the first portion of the first semiconductor structure.

3. The semiconductor device structure of claim 1, wherein the first portion and the second portion of the first semiconductor structure and the first portion and the second portion of the second semiconductor structure are in direct contact with a top surface of the second dielectric layer.

4. The semiconductor device structure of claim 1, wherein the first portion and the second portion of the first semiconductor structure are made of a first semiconductor material, the first portion and the second portion of the second semiconductor structure are made of a second semiconductor material, such that the first semiconductor material is different from the second semiconductor material.

5. The semiconductor device structure of claim 4, wherein the first semiconductor material includes silicon (Si) or silicon germanium (SiGe).

6. The semiconductor device structure of claim 4, wherein the second semiconductor material includes germanium (Ge).

7. The semiconductor device structure of claim 1, wherein the first dielectric layer and the second dielectric layer are made of different materials.

8. The semiconductor device structure of claim 7, wherein the first dielectric layer includes silicon oxide, and the second dielectric layer includes silicon nitride.

9. A semiconductor device structure, comprising:
a first dielectric layer disposed on a top surface of a semiconductor substrate, wherein the first dielectric layer is made of a material adapted to be removed during an etching process;
a second dielectric layer disposed on and in contact with a top surface of the first dielectric layer, wherein the second dielectric layer is made of a material adapted to be removed during the etching process;
a first semiconductor structure disposed over the second dielectric layer, wherein the first semiconductor structure has a first portion, a second portion separated from the first portion, and a third portion separated from the second portion; and
a second semiconductor structure disposed over the second dielectric layer, wherein the second semiconductor structure has a first portion, a second portion separated from the first portion, and a third portion separated from the second portion,
wherein a sidewall of the first portion of the second semiconductor structure adjoins a sidewall of the first portion of the first semiconductor structure, and a sidewall of the second portion of the second semiconductor structure adjoins a sidewall of the second portion of the first semiconductor structure, such that the first portion and the second portion of the second semiconductor structure are located between the first portion and the second portion of the first semiconductor structure;
wherein a sidewall of the third portion of the second semiconductor structure adjoins a sidewall of the third portion of the first semiconductor structure, such that the second portion and the third portion of the first semiconductor structure are located between the second portion and the third portion of the second semiconductor structure;
wherein the first semiconductor structure and the second semiconductor structure are made of different materials and collectively form a composite hard mask for being utilized in the etching process for the first dielectric layer and the second dielectric layer.

10. The semiconductor device structure of claim 9, wherein the first semiconductor structure includes silicon (Si), and the second semiconductor structure includes germanium (Ge).

11. The semiconductor device structure of claim 9, wherein a top surface of the first portion of the first semiconductor structure is level with a top surface of the first portion of the second semiconductor structure.

12. The semiconductor device structure of claim 9, wherein a bottom surface of the first portion of the first semiconductor structure and a bottom surface of the first portion of the second semiconductor structure are in direct contact with a top surface of the second dielectric layer.

13. The semiconductor device structure of claim 9, wherein a distance between the first portion and the second portion of the first semiconductor structure is larger than a distance between the second portion and the third portion of the first semiconductor structure.

14. The semiconductor device structure of claim 13, wherein a distance between the first portion and the second portion of the second semiconductor structure is less than a distance between the second portion and the third portion of the second semiconductor structure.

15. The semiconductor device structure of claim 14, wherein the distance between the first portion and the second portion of the second semiconductor structure is the same as the distance between the second portion and the third portion of the first semiconductor structure.

* * * * *